United States Patent [19]

Abe et al.

[11] 4,277,746
[45] Jul. 7, 1981

[54] GAS-INSULATED ELECTRIC APPARATUS AND METHOD OF DETECTING PARTIAL DISCHARGE THEREIN

[75] Inventors: Kozin Abe; Norihira Uozumi; Kazuaki Oishi, all of Hitachi, Japan

[73] Assignee: Hitachi, Ltd., Tokyo, Japan

[21] Appl. No.: 8,840

[22] Filed: Feb. 2, 1979

[30] Foreign Application Priority Data

Feb. 3, 1978 [JP] Japan ............................. 53-10493

[51] Int. Cl.³ ..................... G01R 31/00; H02G 5/06; H01B 9/06
[52] U.S. Cl. ................................. 324/72; 174/11 R; 174/28; 323/364; 324/133
[58] Field of Search ............. 174/11 R, 11 BH, 16 B, 174/22 C, 28; 323/93; 324/54, 72, 126, 133

[56] References Cited

U.S. PATENT DOCUMENTS

| | | | |
|---|---|---|---|
| 3,652,778 | 3/1972 | Sakai | 174/28 |
| 3,781,454 | 12/1973 | Olsen | 174/11 R |
| 3,869,665 | 3/1975 | Kenmochi et al. | 324/54 X |
| 3,949,157 | 4/1976 | Billings, Jr. et al. | 174/28 X |
| 3,962,609 | 6/1976 | Chaudhuri | 323/93 X |
| 3,988,684 | 10/1976 | Muller et al. | 323/93 |

FOREIGN PATENT DOCUMENTS 49-70183   7/1974   Japan .
51-122786 10/1976  Japan .
51-122787 10/1976  Japan .
51-122788 10/1976  Japan .

Primary Examiner—Laramie E. Askin
Attorney, Agent, or Firm—Craig & Antonelli

[57] ABSTRACT

In a gas-insulated electric apparatus, such as a gas-insulated switchgear and a gas-insulated bus, having an insulating-gas-filled metallic container or sheath within which an electric conductor carrying a high-voltage current is supported by an insulating supporter, a potential detected by a first potential detector through at least a portion of the insulating supporter and another potential detected as a reference value by a second potential detector through an electro-static capacity disposed between the metallic container and the second potential detector are fed to the inputs of a differential amplifier of a partial discharge detecting device to thereby detect possible partial discharges along the insulating supporter with high sensitivity.

14 Claims, 10 Drawing Figures

GAS-INSULATED ELECTRIC APPARATUS AND METHOD OF DETECTING PARTIAL DISCHARGE THEREIN

BACKGROUND OF THE INVENTION

1. Field of the Invention

The present invention relates to gas-insulated electric apparatus and more particularly to gas-insulated electric apparatus in which a partial discharge detecting device and method are provided at an insulating supporter which supports an electric conductor carrying a high-voltage current (hereinafter simply referred to as "conductor") within an insulating-gas-filled metallic container of the apparatus such that possible partial discharges can be detected with ease.

2. Description of the Prior Art

Known gas-insulated electric apparatus, such as gas-insulated switchgear, gas-insulated buses (hermetically sealed bus) and the like, have a conductor encased in a metallic container. The conductor is supported by insulating supporter means such as an insulating spacer. In the thus arranged apparatus, it is impossible to visually inspect an accidental partial discharge along the insulating supporter. Accordingly, it is necessary to detect such partial discharges occurring in the electric apparatus of this type, exteriorly thereof with high accuracy.

The insulating supporter means herein referred to typically includes a disc-like insulating spacer for dividing the interior of the metallic container into several gas chambers as well as for supporting a conductor, a rod-like insulator for merely supporting a conductor, and the like.

The following description will be given, by way of example, on a hermetically sealed bus.

In a hermetically sealed bus, a power feed conductor or bus conductor is supported within a cylindrical metallic container by insulating spacers moulded out of an epoxy resin and a high insulation gas is filled in the container to ensure insulation between the bus conductor and the container. On the surface of each insulating spacer having the above-mentioned construction, foreign materials such as dust may be deposited to cause a partial discharge along the surface of the spacer and in the event such a partial discharge is allowed to continue for a long period under the application of a high-voltage, a tree-like discharge corrosion may be created and grown on the surface of the spacer, resulting in a serious accident.

Measures for detecting such a partial discharge have hitherto been discussed. In one of the measures, for example, it is proposed to employ a shield ring for mitigating the electric field as an electrode for the discharge detection. The shield ring, however, is connected to an embedded metallic thimble by way of metallic wires fixed during molding. This makes it difficult to float and lead out a potential at the shield ring. It is of course possible to provide a separate or independent metallic lead-out member supported by an additional spacer. But this measure requires an extensive change in the conventional fabrication process and presents a safety hazard of a high potential appearing at the lead terminal, and thus has not yet been put into practice.

As an alternative, a measure has been proposed wherein an auxiliary electrode is provided around the exposed outer peripheral surface of the insulating spacer to provide a capacity division voltage from which the discharge is detected. This latter measure as well as the former measure utilizing the shield ring, however, are defective because of their detection sensitivity.

More particularly, both of the measures discussed above have a high input impedance and give the measuring system a large magnitude of inductive noise, resulting in difficulties with the discrimination of the noise from the detection signal because such discrimination cannot be solved by merely increasing the amplification degree of the measuring instrument, thus leading to degraded detection sensitivity.

According to experiments conducted by the inventors of the present applicaton, the conventionally proposed measures were rather successful in detecting discharges of 100 to several 100 PC, but the detection level would be decreased if measured in a noisy environment such as in field test.

On the other hand, it is demanded that attention be paid to the fact that even a discharge of the order of 10 PC will degrade the insulating support, such as a spacer, which is loaded with a high electric field, and hence in a hermetically sealed bus a highly sensitive detection for inspecting partial discharges poses an important problem.

U.S. Pat. Nos. 3,652,778, 3,781,454 and 3,949,157, for example, disclose an insulating supporter which supports a conductor passing through the interior of a metallic container. Laid-open Japanese patent applications Nos. 122,786/'76, 122, 787/'76, 122, 788/'76 and 70,183/'74, for example, disclose diagnosis for the insulation of an insulating supporter.

SUMMARY OF THE INVENTION

An object of the present invention is to provide, in gas-insulated electric apparatus, a partial discharge detecting device and method capable of detecting possible partial discharges occurring along an insulating supporter which supports a conductor, exteriorly of a metallic container with ease and high sensitivity.

According to the invention, in a gas-insulated electric apparatus comprising an insulating-gas-filled metallic container within which a conductor is supported by an insulating supporter, a first potential detector is disposed opposite to the feed conductor through the insulating supporter, a second potential detector for a reference potential is disposed near the first potential detector, and the detected potentials from both the detectors are fed to the inputs of a differential amplifier of a partial discharge detecting device to thereby detect a partial discharge along the insulating supporter.

The second potential detector is disposed opposite to the metallic container through an electrostatic capacity and connected to the input of the differential amplifier. Since the metallic container is sensitive to similar noise to that sensed by the conductor, a highly sensitive detection of possible partial discharges can be ensured. Further, the use of the metallic container permits disposition of the second potential detector exteriorly of the metallic container so that the invention can be applied to conventional gas-insulated electric apparatus without requiring substantial changes in the construction of the same.

For arranging the first potential detector, the insulating supporter itself, to be described later, may be so constructed as to be adaptive to the aforementioned detection or, alternatively, the first potential detector may be mounted to the insulating supporter according to demand.

Accordingly, in accordance with one embodiment of the invention, it is possible to detect the partial discharge by temporarily mounting necessary component members to a conventional gas-insulated electric apparatus which has no partial discharge detecting means. Of course, it is also possible to construct a gas-insulated electric apparatus with built-in component members necessary for the detection.

DESCRIPTION OF THE PREFERRED EMBODIMENTS

Figure 1:
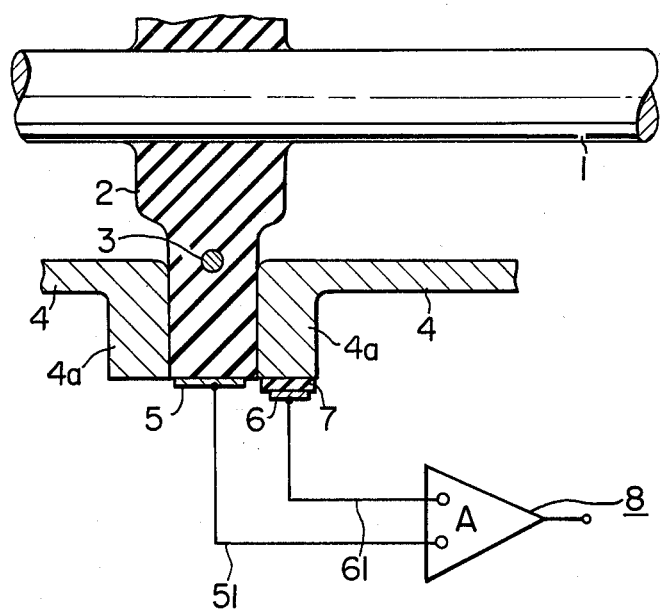
FIGS. 1, 2 and 3 are longitudinal sectional views showing different embodiments of gas-insulated electric apparatus to which different partial discharge detecting means are applied according to the invention.

Referring now to FIG. 1, there is shown an insulating spacer 2 as an example of an insulating supporter. A metallic container 4 is composed of a plurality of sections each having flanges 4a at its opposite ends, so that adjacent two flanges 4a sandwich the insulating spacer 2. The adjacent flanges 4a and the insulating spacer 2 are mutually coupled by tightening bolts (not shown).

The insulating spacer 2 is disc-like or cone-like as well known in the art and is usually moulded out of an eposy resin to form a dielectric member. Accordingly, when an electrode 5 acting as a first potential detector and electrically insulated from the adjacent members is put into intimate contact with the outer peripheral surface of the insulating spacer 2 at the portion thereof exposed to the outside of the metallic container, a desired electrostatic capacity can be provided between the electrode 5 and a conductor 1. As the electrode 5, electrically conductive tape, electrically conductive paint or the like can be used. From the standpoint of easy handling, however, it is rather advantageous to place on the outer peripheral surface of the insulating spacer 2 a thin strip made of a metallic material such as aluminum or copper when detection of partial discharges is made.

The electrode 5 acting as the first potential detector can utilize the conventional insulating spacer and does not need an independent or additional insulating spacer for its own use, because the potential associated with this detector can be easily led out of the container 4. This electrode 5 is connected to one terminal of a detecting device 8 comprised of a differential amplifier, through a lead wire 51 in the form of a coaxial cable to provide an input for detection, as will be described later.

For differential operation, another input is applied to another terminal of the detecting device 8 from a lead wire 61 in the form of a coaxial cable which is connected to the metallic container 4 through an electrostatic capacity. In this embodiment, in an attempt to make the same condition for noise, an electrode 6 acting as a second potential detector which is used as a reference potential detector, is mounted to the flange 4a near the insulating spacer 2 through a dielectric member or insulator 7. Accordingly, a desired electrostatic capacity takes place between the flange 4a and the electrode 6. Being also formed exteriorly of the metallic container 4, this electrostatic capacity can easily be provided in a conventional apparatus.

The capacitances of these two electrostatic capacities can of course be adjusted by adjusting the peripheral dimensions of the electrodes 5 and 6.

Within the insulating spacer 2 a shield ring 3 is usually embedded for mitigating the electric field and usually maintained at earth potential to correct disturbance of electric field due to the end portion of the metallic container 4. This shield ring 3 may be used as a partical discharge detector by preparing the insulating spacer as shown in FIG. 2.

Figure 2:
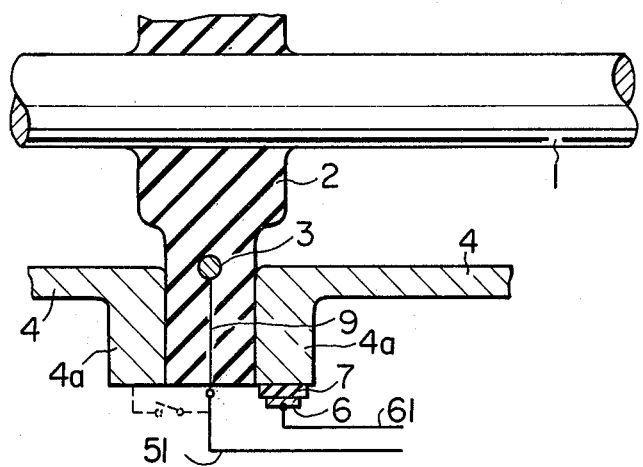

In the embodiment of FIG. 2, an electrostatic capacity for detection takes place between the shield ring 3 and the conductor 1 and a potential at the shield ring 3 embedded in the insulating spacer 2 is led to the outside of the metallic container 4 by way of a conductor 9 in the form of a coaxial cable which is electrically insulated from adjacent members. If desired, the outer end of the conductor 9 can be connected to the metallic container 4, through a switch, as shown by dashed lines in FIG. 2.

Figure 3:
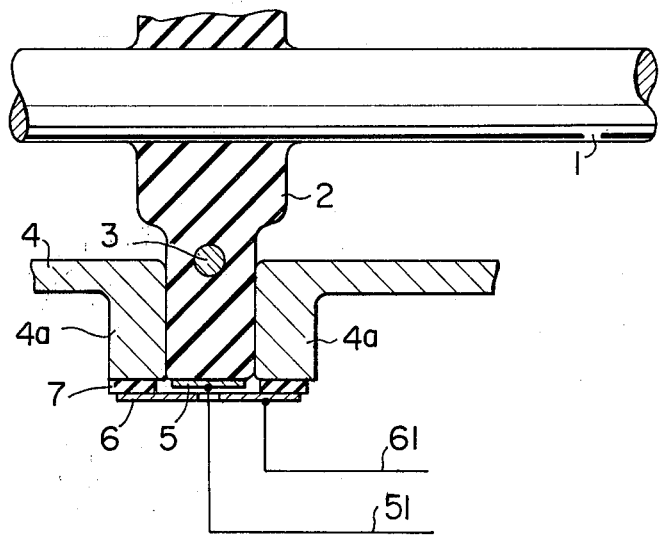

FIG. 3 shows a further embodiment which has two electrostatic capacities formed exteriorly of the metallic container 4 and which may, like the foregoing embodiments, be incorporated into the conventional apparatus.

More particularly, an electrode 5 which acts as the first potential detector and which is electrically insulated from adjacent members is put into intimate contact with the outer peripheral surface of the insulating spacer 2 at the portion thereof exposed to the outside of the metalic container 4. Mounted on the respective outer peripheral surfaces of the two flanges 4a of the metallic container 4 which sandwich the insulating spacer 2 are insulators 7 which extend peripherally and, in the extreme, over the entire periphery with a predetermined spacing between them. An electrode 6 acting as the second potential detector which is provided for a reference potential detector is mounted on the flanges 4a through these insulators 7 to surround the electrode 5. The two electrodes 5 and 6 are insulated from each other and led by way of lead wires 51 and 61, respectively.

In the foregoing embodiments, electrostatic capacities $C_2$, $C_4$, $C_1$ and $C_3$ take place between the conductor 1 and the first electrode 5, between the flange 4a and the second electrode 6, between the conductor 1 and the metallic container 4 along the surface of the insulating spacer 2, and between the first electrode 5 and the metallic container 4, respectively.

Figure 4:
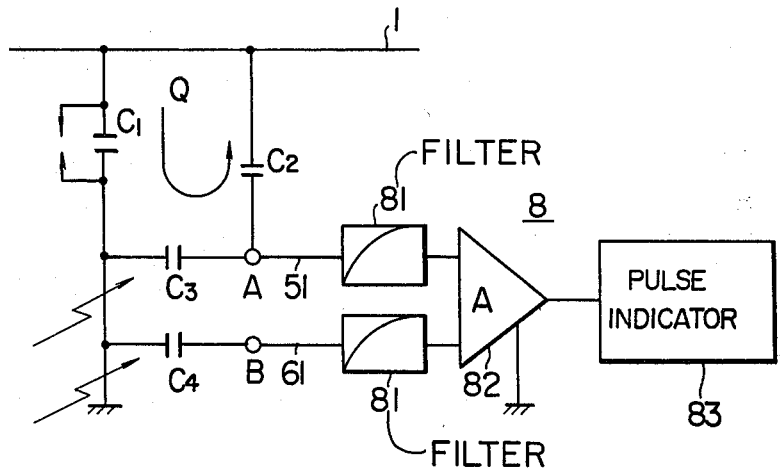
FIG. 4 is an equivalent circuit diagram of the partial discharge detecting means shown in FIGS. 1, 2 and 3.

Although not constituting the same circuit owing to slightly different dispositions of the electrodes in the strict sense, the foregoing embodiments may be generally explained by way of an equivalent circuit as outlined in FIG. 4.

Under the presence of the electrostatic capacity $C_1$ between the power feed conductor 1 and the container 4 along the surface of the spacer 2, when a partial discharge Q takes place along the surface of the spacer 2, a pulse response appears at a first potential detector terminal A in proportion to a ratio $C_2/C_3$, where $C_2$ represents the electrostatic capacity between the conductor and the first potential detector and $C_3$ represents the electrostatic capacity between the first potential detector and the metallic container (grounded). Due to the electrostatic capacity $C_4$ between the grounded metallic container and a second potential detector terminal B, a reference potential close to earth potential appears at the terminal B. These potentials are applied to the inputs of the detecting device 8 and utilized to detect the occurrence of local discharges.

The partial discharge detecting device 8 comprises high-pass filters 81, a differential amplifier 82, and a pulse indicator 83.

Figure 5:
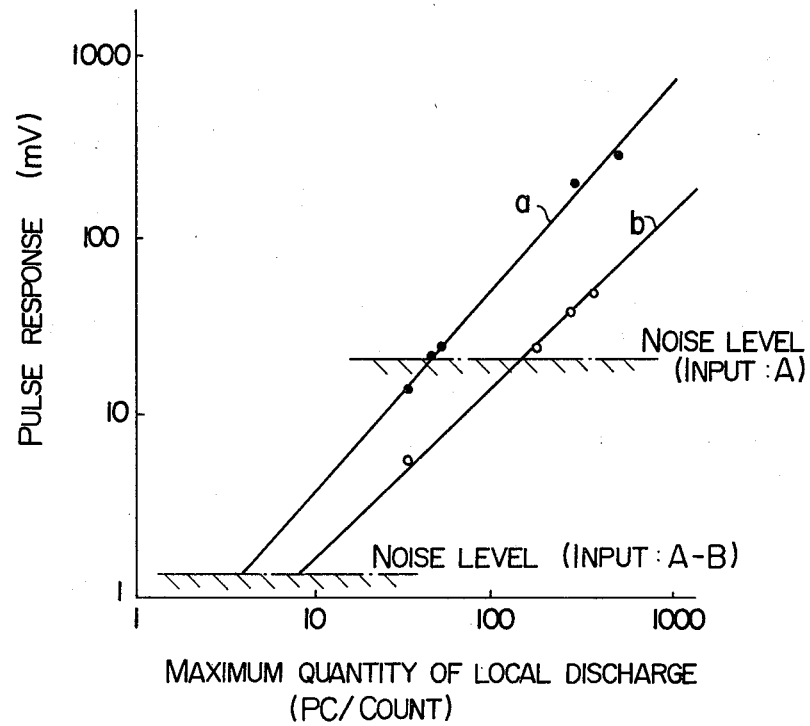
FIG. 5 is a graph showing pulse response characteristics obtained from experimental results according to a method of the invention.

FIG. 5 shows values measured with a partial discharge detecting device having a band width of 40 KHz to 5 MHz and an amplification degree of 45 dB. Exemplified curves a and b are respectively representative of detection sensitivity with respect to a maximum quantity of discharge due to a discharge Q along the surface of the insulating spacer 2.

In the embodiment shown in FIG. 2, the electrostatic capacity $C_2$ can be larger than that in the other embodiments so that measuring sensitivity can be improved by several times. The embodiment shown in FIG. 3 has the first electrode which is identical with that of FIG. 1 embodiment so that both the embodiments have the same pulse response.

The most important factor for determining measurable maximum sensitivity in discharge detection is the ability to discriminate necessary signals from ambient noise.

Detection of the phase difference between the discharge pulse and the noise or discriminating circuit to detect the difference in rise time between the discharge pulse and the noise, for example, is applied for discriminating necessary signals from the ambient noise, but such a measure requires an expensive detector and is not always reliable.

In contrast, the measure shown in FIG. 4 offers a most simple and reliable noise discrimination wherein ambient noise potentials appearing at the potential detector terminals A and B are coupled to the differential inputs and the noise signals to be transmitted to the pulse detection and amplifier circuit are cancelled out.

Generally, various stray currents including pulsating currents due to switching surge flow through the grounded container 4 which surrounds the high voltage charging circuit, and potentials associated with the stray currents appear at the first and second potential detector terminals A and B. For easy cancellation of the differential inputs, the stray current potentials appearing at both the terminals A and B are desirably equal to each other and, therefore, it is preferable to select the thickness of the insulator 7 and the area of the electrode such that the elecrostatic capacity $C_4$ between the second electrode 6 and ground are substantially equal to the electrostatic capacity $C_3$.

Another noise source such as spatial electromagnetic waves such as broadcasting waves should also be taken into consideration. The apparatus is rather insensitive to such spatial electromagnetic waves in view of the wave length thereof. The first and second potential detectors may still function as a kind of antenna for receiving such electromagnetic waves. Accordingly, the length and the configuration of these potential detectors are preferably made identical.

With the first and second potential detector electrodes, as will be seen from FIG. 5, noise attenuation more than 20 dB and detection of a small discharge of the order of 10 pC were attained which were unsuccessful with the single input from only the first electrode.

The second potential detector electrode shown in the FIG. 3 embodiment is advantageous to show shield effect against the spatial electromagnetic waves. An increased electrostatic capacity between the first and second potential detector electrodes (between the terminals A and B), however, branches a portion of the discharge signal to the electrostatic capacity $C_4$, thereby decreasing detection sensitivity. Accordingly, the intervening insulation is preferably of a small dielectric constant such as air insulation and, practically, a capacitance of less than $C_4/10$ is satisfactory.

Figure 6:
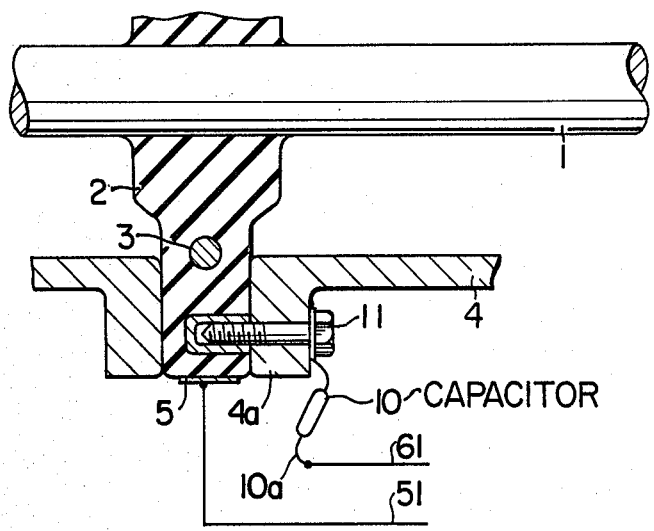
FIGS. 6, 7, 8, 9 and 10 are longitudinal sectional views showing further different embodiments of gas-insulated electric apparatus to which different partial discharge detecting means are applied according to the invention.

FIG. 6 shows a further embodiment of the invention which comprises a different construction for obtaining an electrostatic capacity $C_4$. In this embodiment, the electrode 6 acting as the second potential detector in FIG. 1 is omitted and, alternatively, a capacitor 10 of a desired capacitance is provided. One end of the capacitor 10 is connected to the metallic container 4 by means of bolts 11 which are used to mechanically couple the insulating spacer 2 and the flange 4a, with the other end connected to the lead wire 61.

In this manner, the electrostatic capacity $C_4$ between the metallic container 4 and the other end lead wire 10a connected to one input of the detector device is easily obtained exteriorly of the metallic container 4. The capacitor 10 is easily mounted to the container by means of the bolt 11. Alternatively, this capacitor 10 may be embedded in the insulating spacer 2 if so desired.

Figure 7:
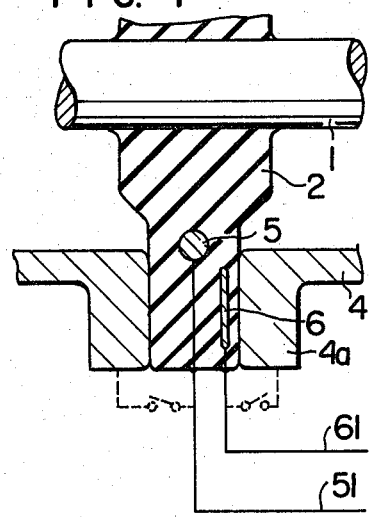

In a further embodiment shown in FIG. 7, an electrode 5 acting not only as a shield ring but also as the first potential detector and an electrode 6 acting as the second potential detector which is used as a reference potential detector are embedded in the insulating spacer 2. These electrodes which are electrically insulated from each other are led to the outside of the metallic container 4.

Figure 8:
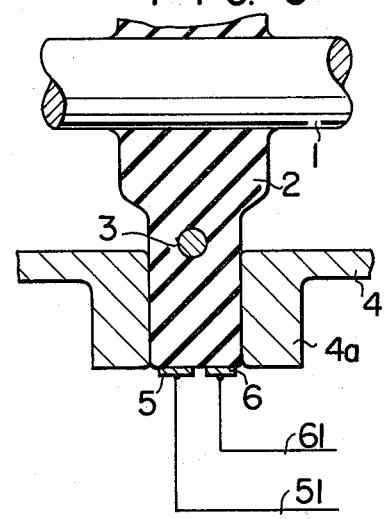

In a further embodiment shown in FIG. 8, an electrode 5 acting as the first potential detector and another electrode 6 acting as the second potential detector for a reference potential are mounted to the portions of the outer surface of the insulating spacer 2 which are exposed to the outside of the metallic container 4. With this construction, it will be easily appreciated that possible partial discharges can be detected in the same manner as the foregoing embodiments.

Figure 9:
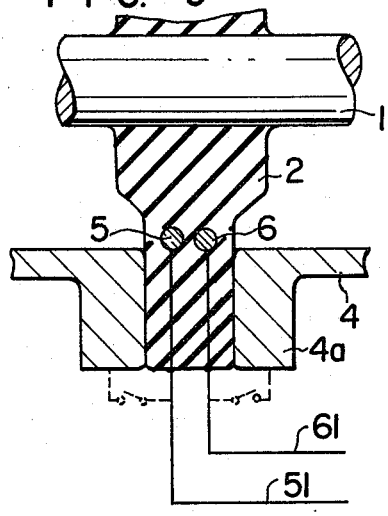
Figure 10:
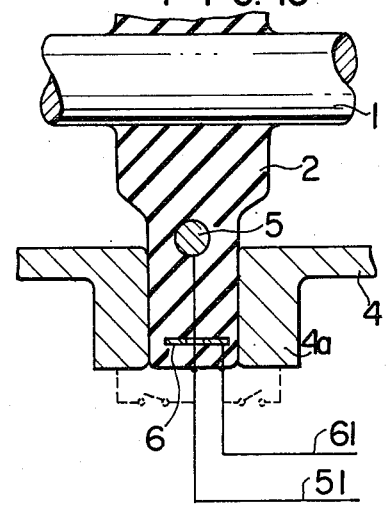

In each of further embodiments shown in FIGS. 9 and 10, like the embodiment of FIG. 7, electrodes 5 and 6 respectively acting as the first and second potential detectors are embedded in the insulating spacer 2. Especially, in FIG. 9, electrically conductive rings of substantially the same configuration are embedded in the insulating spacer in parallel relation around the same axis and in FIG. 10, an electrode 5 also acting as the shield ring and a strip electrode 6 are concentrically embedded in the insulating spacer 2. With these constructions, possible partial discharges can effectively be detected in the same manner as the foregoing embodiments.

In any of the foregoing embodiments, the partial discharge detecting device 8 may be built in the apparatus or may temporarily be connected to the apparatus when measuring possible partial discharges.

In a normal operation in which the electrodes 5 and 6 are not used as the first and second potential detectors respectively, these electrodes 5 and 6 are preferably maintained at the same potential as that of the metallic container 4 to prevent electrically adverse effect. Specifically, in the embodiments of FIGS. 2, 7, 9 and 10 wherein the electrodes 5 and 6 are embedded in the insulating spacer 2, these electrodes are preferably switchable to the metallic container 4 through a switch as shown with dotted lines so that the partial discharge detection mode is switched to the potential equilizing connection mode or vice versa by operating the switch.

Although having been described by way of an example of an insulating spacer as the annular insulating supporter, the invention may easily be applied to a rod-shaped insulating supporter.

As described above, with the gas-insulated electric apparatus according to the invention, it is possible to detect the partial discharge along the insulating supporter from the outside of the apparatus with high sensitivity under the condition where ambient noise is eliminated. The detection method according to the invention utilizes means for obtaining two potentials and the partial discharge detector device and hence can detect the partial discharge very easily.

We claim:

1. In a gas-insulated electric apparatus comprising an insulating-gas-filled metallic container within which a conductor carrying a high voltage current is supported by an insulating supporter, the improvement which comprises a first electrode disposed opposite to said conductor so as to form a first electrostatic capacity therebetween through at least a portion of said insulating supporter, a capacitor having a second electrostatic capacity and having one end connected to the outside of said metallic container, and a detecting device including a differential amplifier, said first electrode and the other end of said capacitor being connected to respective inputs of said differential amplifier.

2. A method of detecting a partial discharge applicable to a gas-insulated electric apparatus including an insulating-gas-filled container within which a conductor carrying a high-voltage current is supported by an insulating supporter, said method comprising the step of applying a first potential detected from said conductor through a first electrostatic capacity formed through at least a portion of said insulating supporter and a second reference potential detected as a reference value from said metallic container through a second electrostatic capacity which is substantially equal to said first electrostatic capacity to respective inputs of a differential amplifier comprised by a detecting device, whereby a local discharge along said insulating supporter is detected.

3. In a gas-insulated electric apparatus comprising an insulating-gas-filled metallic container within which a conductor carrying a high-voltage current is supported by an insulating supporter, the improvement which comprises a first potential detecting means disposed opposite to said conductor so as to provide a first electrostatic capacity therebetween, a second potential detecting means disposed opposite to said metallic container so as to provide a second electrostatic capacity therebetween, said first and second potential detecting means being located so that said first and second electrostatic capacities are substantially equal to each other, and means disposed at the outside of said metallic container and coupled to the first and second potential detecting means for exhibiting a potential corresponding to a first potential detected at said first potential detecting means, on the basis of a second reference potential provided at said second potential detecting means.

4. A gas-insulated electric apparatus according to claim 3 wherein said first potential detecting means comprises a first elelctrode disposed opposite to said conductor through at least a portion of said insulating supporter so as to form said first electrostatic capacity therebetween, and said second potential detecting means comprises a second electrode disposed opposite to said metallic container through an insulator, so as to form said second electrostatic capacity therebetween.

5. A gas-insulated electric apparatus according to claim 3, wherein said first and second potential detecting means respectively comprise a first and a second electrode both embedded in said insulating supporter in a manner so that said first electrode and said conductor form said first elelctrostatic capacity therebetween through a portion of said supporter and said second electrode and said metallic container form said second electrostatic capacity therebetween through a portion of said supporter.

6. A gas-insulated electric apparatus according to claim 3, wherein said metallic container has flanges, said insulating supporter comprising a substantially disc-like insulating spacer airtightly fixed to said flanges, said first electrostatic capacity being formed between said first electrode and said conductor through at least a portion of said insulating spacer, said second electrode being disposed on a portion of an outer peripheral surface of at least one of said flanges through said insulator.

7. A gas-insulated electric apparatus according to claim 3, wherein said metallic container has flanges and said insulating supporter comprises a substantially disc-like insulating spacer airtightly fixed to said flanges, said first and second potential detecting means respectively comprising a first and a second electrode separately disposed on an outer peripheral surface of said insulating spacer in a manner so that said first and said second capacities are formed between said first electrode and said conductor and between said second electrode and at least one of said flanges, respectively, each through said spacer.

8. A gas-insulated electric apparatus according to claim 3, 4, 5, 6 or 7, wherein said potential exhibiting means comprises a differential amplifier, said first potential and said second reference potential being applied to the respective inputs of said differential amplifier.

9. A gas-insulated electric apparatus according to claim 4 or claim 5, wherein said apparatus comprises a shield ring embedded in said insulating supporter, said shield ring being used also as said first electrode.

10. A gas-insulated electric apparatus according to claim 9, wherein said potential exhibiting means comprises a differential amplifier, said first potential and said second reference potential being applied to the respective inputs of said differential amplifier.

11. In a gas-insulated electric apparatus comprising an insulating-gas-filled metallic container within which a conductor carrying a high-voltage current is supported by an insulating supporter, the improvement which comprises a first electrode disposed opposite to said conductor so as to form a first electrostatic capacity therebetween through at least a portion of said insulating supporter, an electrically conductive member connected to said metallic container through a second electrostatic capacity, said first electrode being located relative to the conductor so that said first and second electrostatic capacities are substantially equal to each other, and a detecting device having a differential amplifier, said first elelctrode and said conductive member being connected to respective inputs of said differential amplifier.

12. In a gas-insulated electric apparatus comprising an insulating-gas-filled metallic container within which a conductor carrying a high-voltage current is supported by an insulating supporter, the improvement which comprises a first elelctrode disposed opposite to said conductor so as to form a first electrostatic capacity therebetween through at least a portion of said insulating supporter, a capacitor having a second electrostatic capacity and having an end connected to a portion of an outer surface of said metallic container, said first electrode being located relative to said conductor so that said first and second electrostatic capacities are substantially equal to each other, and means disposed at the outside of said metallic container and coupled to the first electrode and the other end of said capacitor for exhibiting a potential equal to that at said first electrode on the basis of a reference potential provided at the other end of said capacitor.

13. A gas-insulated electric apparatus according to claim 12, wherein said insulating supporter comprises a substantially disc-like insulating spacer having an outer surface exposed to the outside of said metallic container, said first elelctrode being put into intimate contact with said outer surface of said insulating spacer.

14. In a gas-insulated electric apparatus comprising an insulating-gas-filled metallic container with flanges each having an opening, a conductor carrying a high-voltage current, and an insulating spacer fixed to said flanges by means of a bolt, said insulating spacer airtightly sealing the openings of said flanges and supporting said conductor within said metallic container, the improvement which comprises a first electrode disposed opposite to said conductor so as to form a first electrostatic capacity therebetween through at least a portion of said insulating spacer, a capacitor having a second electrostatic capacity and having one end connected to said metallic container by means of said bolt, said first electrode being located relative to said conductor so that said first and second electrostatic capacities are substantially equal to each other, and means disposed at the outside of said metallic container and coupled to the first electrode and the other end of said capacitor for exhibiting a potential equal to that at said first electrode on the basis of a reference potential provided at the other end of said capacitor.

* * * * *